United States Patent [19]

Nichols

[11] 4,404,520

[45] Sep. 13, 1983

[54] DIFFERENTIAL ABSOLUTE EQUALIZATION MEASUREMENT CIRCUIT

[75] Inventor: Richard A. Nichols, Richardson, Tex.

[73] Assignee: Rockwell International Corporation, El Segundo, Calif.

[21] Appl. No.: 304,428

[22] Filed: Sep. 21, 1981

Related U.S. Application Data

[63] Continuation of Ser. No. 51,768, Jun. 25, 1979.

[51] Int. Cl.³ .................. G01R 23/00; G01R 23/12
[52] U.S. Cl. ................................. 324/82; 324/83 A
[58] Field of Search ............ 324/83 A, 83 R, 78 E, 324/78 Z, 86, 140 D, 82; 331/17

[56] References Cited

U.S. PATENT DOCUMENTS

| | | | |
|---|---|---|---|
| 3,329,895 | 7/1967 | Lenz | 324/82 |
| 3,391,343 | 7/1968 | McCurdy | 324/82 |
| 4,017,801 | 4/1977 | Riedel | 324/82 |
| 4,103,141 | 7/1978 | Wristen | 219/130.01 |
| 4,155,050 | 5/1979 | Nichols | 331/17 |
| 4,195,333 | 3/1980 | Hedel | 363/21 |

OTHER PUBLICATIONS

Skilling, Hugh, "Electrical Engineering Circuits", John Wiley and Sons, Inc., 1957, pp. 410-412.
National Semiconductor TTL Data Book, National Semiconductor Corp., pp. 1-2 and 1-10, 1976.
Differential Delay Measurement Using Two Bit Error Measuring Test Sets, Internal Publication of Rockwell Intl., 5/78.

*Primary Examiner*—David K. Moore
*Attorney, Agent, or Firm*—Richard K. Robinson; Howard R. Greenberg; H. Fredrick Hamann

[57] ABSTRACT

A circuit for measuring the Differential Absolute Delay Equalization between two data signals (each signal consisting of a data stream and its associated clock) is provided. The circuit generates an equalization error signal which is a composite of error signal and a pedestal voltage. The circuit also generates a replica of the pedestal voltage by taking the algebraic summation of the output of the comparison circuit and the complement of the output of the comparison circuit. The equalization error is the difference between the error signal and the replica pedestal voltage.

6 Claims, 4 Drawing Figures

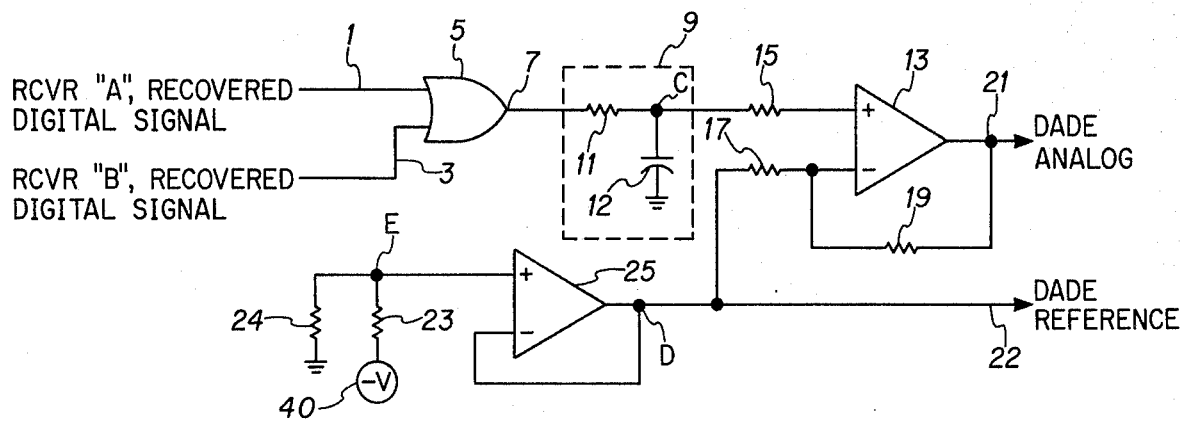
FIG. 1
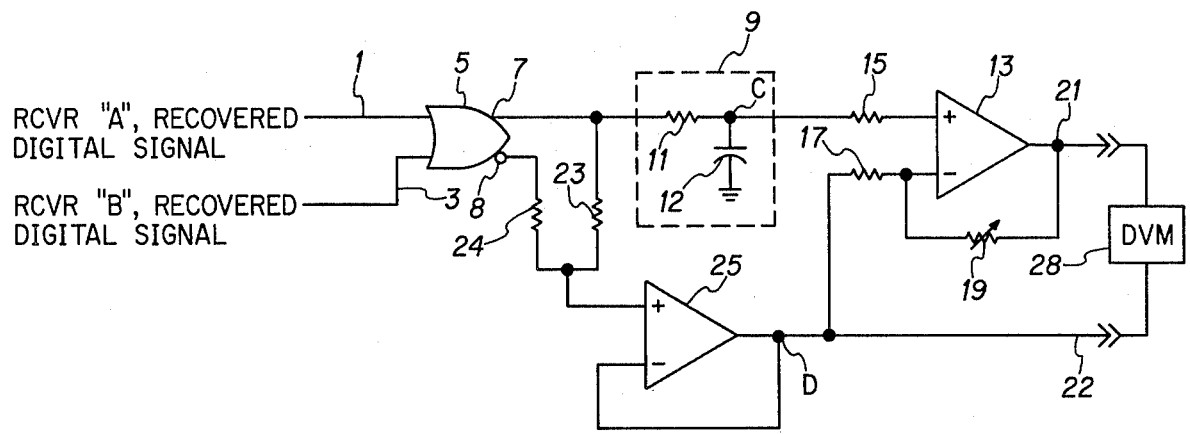
FIG. 2
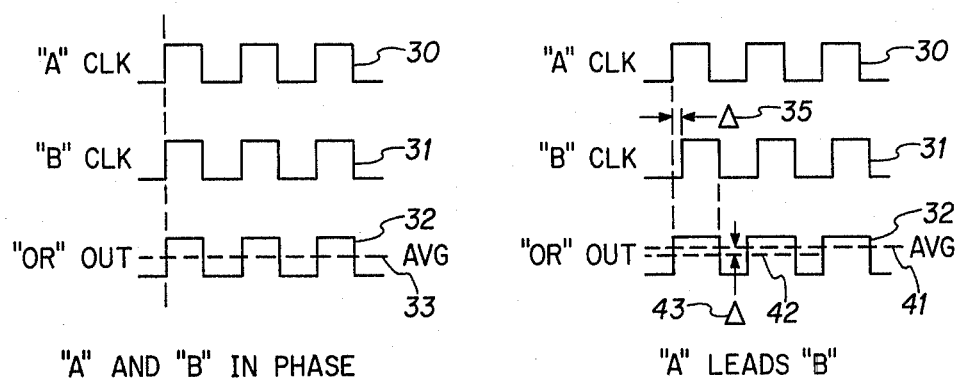
FIG. 3a  "A" AND "B" IN PHASE
FIG. 3b  "A" LEADS "B"

DIFFERENTIAL ABSOLUTE EQUALIZATION MEASUREMENT CIRCUIT

This is a continuation, of application Ser. No. 051,768, filed June 25, 1979.

DESCRIPTION OF THE PRIOR ART AND BACKGROUND OF THE INVENTION

This invention relates to differential absolute delay equalization measuring circuits.

It is often necessary in circuits such as data switches to provide an analog signal which represents the system DADEing (Differential Absolute Delay Equalization). Once the DADEing has been determined, a correction can be made by inserting a delay into the leading data signal path to ensure that both data steams and both associated clocks are in phase. When the two signal paths have been properly DADEed, then switching between data sources can be accomplished without introducing data errors.

Heretofore, the DADEing was measured by a time measurement device such as an oscilloscope or elapse time clock. The time measurement device is triggered on by the leading edge of a pulse of the leading signal and turned off by the leading edge of a pulse of the following signal. Implementation of the Prior Art method required either manual intervention or complex timing and triggering circuits.

A circuit for measuring the Differential Absolute Delay Equalization between two data signals (each signal consisting of a data stream and its associated clock) is provided. The circuit generates an equalization error signal which is a composite of error signal and a pedestal voltage. The circuit also generates a replica of the pedestal voltage by taking the algebraic summation of the output of the comparison circuit and the complement of the output of the comparison circuit. The equalization error is the difference between the error signal and the replica pedestal voltage.

The invention provides for comparing two receive clock pulses (or data pulses) and generating an "OR" of the two receive clock pulses as well as the complementary form of the "OR" or "NOR" of the two circuitries in one embodiment. The replica pedestal voltage is generated in one of two ways, the preferred being by algebraically summing the "OR" and the "NOR" signals and using the resultant to subtract from the average of the "OR" of the two clock pulses to generate the differential absolute delay equalization error. The generating of the replica pedestal voltage from circuitry that is also used to provide the comparison output minimizes the effects of power supply fluctuations and temperature variations upon the circuitry because the voltage levels will track these fluctuations.

Many advantages of the present invention may be ascertained from a reading of the specification and the claims in conjunction with the drawings.

BRIEF DESCRIPTION OF DRAWINGS

FIG. 1 is a block diagram of a differential absolute delay equalization measurement circuit;

FIG. 2 is a block diagram of the preferred embodiment of the invention; and

FIGS. 3a and 3b provide the waveforms that are present in both embodiments.

DETAILED DESCRIPTION OF THE INVENTION

Referring to FIG. 1, the two clock pulses (or data pulses) which for the purposes of this discussion shall be denoted receiver A recovered digital signal and receiver B recovered digital signal are applied to the input terminals 1 and 3 of the comparator circuit 5. The comparator circuit "OR"s the signal A with signal B providing an "OR" output on terminal 7. The "OR" output is averaged by the RC filter 9 that consists of resistor 11 and capacitor 12. The average of the "OR" output is applied to the summing amplifier 13 through resistor 15. The averaged "OR" output is combined with the DADE reference signal or replica pedestal voltage that is applied through resistor 17 to the negative terminal of the summing amplifier 13. The gain of the difference between signals present on the positive and negative terminals of amplifier 13 is determined by resistors 17 and 19, providing an analog voltage at terminal 21 that represents the differential absolute delay equalization The replica pedestal voltage is generated by applying a reference voltage 40 to the voltage divider network that consists of resistor 23 and resistor 24. The replica pedestal voltage is present at the node point E and applied to the voltage follower circuit 25.

The reference voltage must be accurately selected and stable. In addition, the circuitry must be immuned to fluctuations in all voltages caused by temperature and power supply voltage variation in the reference voltage 40 applied to resistor 23 and the operational voltage that is applied to the circuit elements including the comparator 5, the summing amplifier 13 and the voltage follower 25. When there is fluctuation in these voltages, an error in the differential absolute delay equalization signal that is provided on terminal 21 is produced.

In the preferred embodiment shown in FIG. 2, the effects of temperature and power supply variations are minimized.

Referring to FIG. 2, two digital signals such as a receive clock signal or data signal are applied to the dual output comparator 5 with the receiver A signal being applied to terminal 1 and the receiver B signal being applied to terminal 3. The comparator 5 provides an "ORed" output of the two signals on terminal 7 and a "NORed" output of the two signals on terminal 8. The "ORed" output is applied, for averaging, to the RC filter 9 that includes resistor 11 and capacitor 12 which integrates the "OR'ed" output over time. The filtered output that is present at point C that has included therein a pedestal voltage is applied to the summing amplifier 13 through resistor 15.

The replica pedestal voltage is generated by taking the algebraic summation of the "ORed" output of the A and B signals that is present on terminal 7 with the "ORed" output of the two signals that is present upon terminal 8. The algebraic summation is performed by tying terminal 7 to terminal 8 through resistors 23 and 24. If the "OR" output on terminal 7 and the "NOR" output on terminal 8 have identical 1 and 0 values, then resistor 23 should equal resistor 24 for the proper replica pedestal voltage. However, if there is an offset in the logic states, then the network that includes resistors 23 and 24 will have to be adjusted by filtering or other means to ensure that the voltage at the junction of resistors 23 and 24 when there is a logic 1 on terminal 7 and a logic 0 on terminal 8 equals the voltage at the junction of resistors 23 and 24 when there is a logic 0 present on terminal 7 and a logic 1 present on terminal 8.

A more detailed discussion of the algebraic summations of complementary signals is provided in my U.S. Pat. No. 4,155,050, issued on May 15, 1979.

Voltage follower 25 provides isolation for the replica pedestal voltage present at the junction of resistors 23 and 24. The replica pedestal voltage is applied to the negative terminal of the summing amplifier 13 through resistor 17. The gain of the summing amplifier 13 is provided by adjustable resistor 19 and resistor 17.

The differential absolute delay equalization error voltage may be measured by connecting a differential voltmeter 28 between terminals 21 and 22. The digital voltmeter will read the quantity K(C-D) where C is the voltage present at point C and D is the voltage present at point D. This is equal to K (a gain constant) ×(equalization error + pedestal voltage − replica pedestal voltage). This, of course, is equal to K ×(equalization error). The value of K is adjustable to provide the overall sensitivity for the measuring circuit.

In FIG. 3a, waveform 30 represents the A clock or signal, waveform 31 represents the B clock or signal, and waveform 32 represents the "OR" of these signals. Under equal time delay conditions, both the average output at point C of FIGS. 1 and 2 and the replica pedestal voltage at point D of FIGS. 1 and 2 will be coincidence as shown on waveform 32 at dotted line 33.

The case where signal A leads signal B is shown in FIG. 3b. Signal A is shown at 30, signal B is shown at 31 and lags the signal A by delta time as shown at 35. The "OR" output is shown at 32 with the average voltage output at point C of FIG. 2 shown by dotted line 41 being higher than the replica pedestal voltage located at point D and represented by dotted line 42 of FIG. 3b. The analog voltage that represents the Differential Absolute Delay Equalization error measurement is shown at 43.

It is understood that various modifications may be made in the circuit or circuits of the present invention without departing from the spirit and scope of the invention except as limited by the appended claims.

What is claimed is:

1. A differential absolute delay equalization measuring circuit comprising:

OR gate means for comparing the phase relationship between two digital signals and to provide a first ouput signal thereby;
   RC filter means for averaging the first output signal to obtain an average signal;
   means for providing a replica pedestal signal; and
   summing means for obtaining the difference between the average signal and the replica pedestal signal.

2. The differential absolute delay equalization measuring circuit wherein the means for providing a replica pedestal voltage according to claim 1, comprises:
   means for obtaining a second output signal that is the complement of the first output signal; and
   means for algebraically summing the first and second output signals.

3. The differential absolute delay equalization measuring circuit according to claim 1 wherein OR gate means comprises:
   a logic circuit having two inputs and two outputs with one output providing a logic "OR" of the two digital signals present on the two input terminals and the other output being a logic "NOR" of the two digital signals on the two input terminals.

4. The differential absolute delay equalization measuring circuit according to claim 1 wherein the means for providing a replica pedestal signal comprises:
   voltage follower circuit having an input terminal;
   first resistor means connected between the first output signal and the input of the voltage follower; and,
   second resistor means connected between the second output signal and the input of the voltage follower.

5. A method for detecting the differential absolute delay equalization error between two digital signals comprising:
   comparing the phase relationship between the two digital signals and to provide a first output signal thereby;
   averaging the first output signal to obtain an average signal;
   providing a replica pedestal signal; and
   obtaining the difference between the average signal and the replica pedestal signal.

6. The method, according to claim 5, wherein the step of providing a replica pedestal signal, comprising:
   complementing the first signal to obtain a second output signal thereby and algebraically summing the first and second output signals.

* * * * *